United States Patent
Kim et al.

(10) Patent No.: US 7,514,310 B2
(45) Date of Patent: Apr. 7, 2009

(54) DUAL WORK FUNCTION METAL GATE STRUCTURE AND RELATED METHOD OF MANUFACTURE

(75) Inventors: Min-Joo Kim, Gyeonggi-do (KR); Hyung-Suk Jung, Gyeonggi-do (KR); Jong-Ho Lee, Gyeonggi-do (KR); Sungkee Han, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 312 days.

(21) Appl. No.: 11/192,288

(22) Filed: Jul. 29, 2005

(65) Prior Publication Data

US 2006/0115940 A1    Jun. 1, 2006

Related U.S. Application Data

(60) Provisional application No. 60/631,887, filed on Dec. 1, 2004.

(30) Foreign Application Priority Data

Feb. 22, 2005    (KR) ....................... 10-2005-0014719

(51) Int. Cl.
*H01L 21/8238* (2006.01)
(52) U.S. Cl. ................ 438/199; 257/407; 257/E21.632
(58) Field of Classification Search .......... 257/E21.623, 257/407; 438/199
See application file for complete search history.

(56) References Cited

U.S. PATENT DOCUMENTS

| 6,130,123 | A | 10/2000 | Liang et al. |
| 6,483,151 | B2 | 11/2002 | Wakabayashi et al. |
| 6,537,901 | B2 | 3/2003 | Cha et al. |
| 6,815,285 | B2 | 11/2004 | Choi et al. |
| 2004/0222474 | A1 | 11/2004 | Chau et al. |
| 2005/0059198 | A1* | 3/2005 | Visokay et al. ............... 438/199 |
| 2005/0110098 | A1 | 5/2005 | Yoshihara |
| 2005/0258468 | A1* | 11/2005 | Colombo et al. ............ 257/314 |
| 2006/0084217 | A1* | 4/2006 | Luo et al. .................... 438/199 |
| 2007/0059874 | A1* | 3/2007 | Moumen et al. ............ 438/199 |

FOREIGN PATENT DOCUMENTS

| JP | 2004-111549 | 4/2004 |
| WO | WO 03/079444 A1 | 9/2003 |
| WO | WO 2005/048334 A1 | 5/2005 |
| WO | WO 2006/028690 A1 | 3/2006 |

OTHER PUBLICATIONS

Silantev et al., "Control of the Surface Purity of Molybdenum Single Crystals by the Methods of Integral Current Spectroscopy and Contact Potential Difference", Vysokochistyie Veshchestva, p. 197-302 (1988).*
S. Motamarri; Metal Gates for Future CMOS ICs; Internet Research from Department of Electrical and Computer Engineering, University of Houston.

* cited by examiner

*Primary Examiner*—Asok K Sarkar
(74) *Attorney, Agent, or Firm*—Volentine & Whitt, PLLC

(57) ABSTRACT

A semiconductor device and related methods of manufacture are disclosed in which dual work function metal gate electrodes are formed from a single metal layer by doping the metal layer with carbon and/or fluorine.

40 Claims, 10 Drawing Sheets

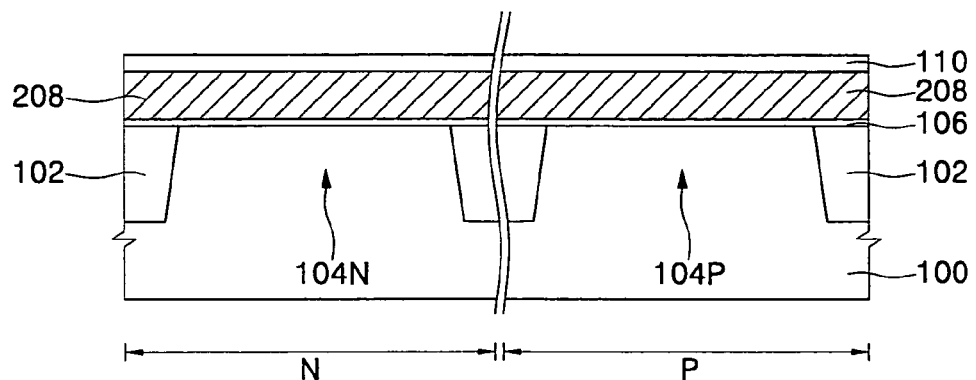
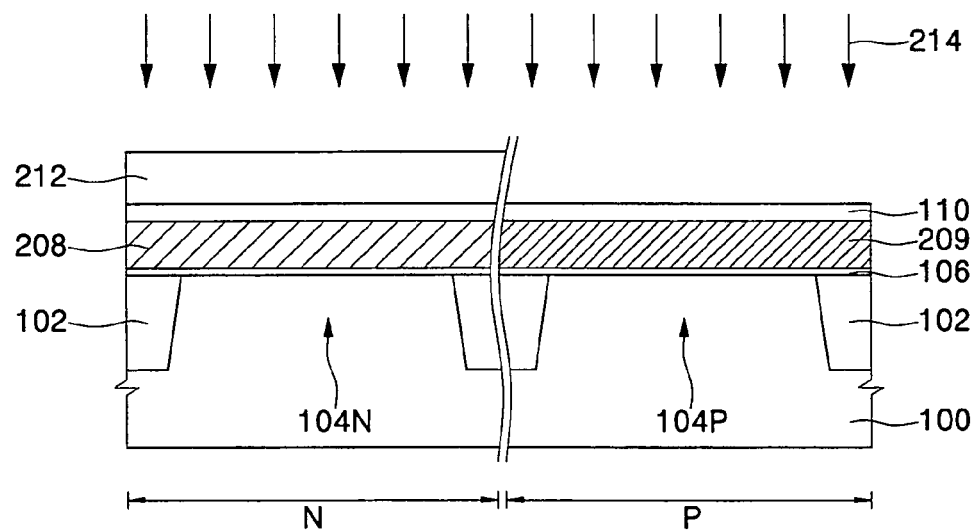
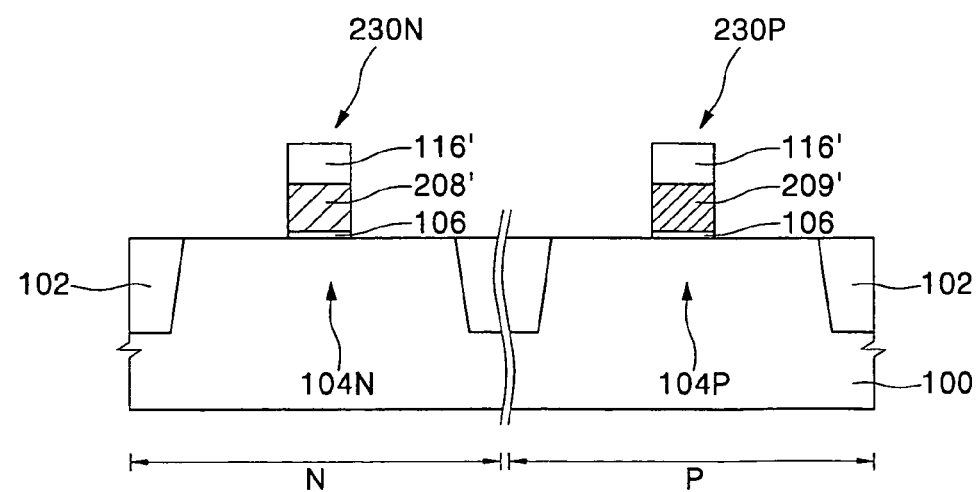

DUAL WORK FUNCTION METAL GATE STRUCTURE AND RELATED METHOD OF MANUFACTURE

This application claims the benefit of U.S. Provisional Application No. 60/631,887 filed Dec. 1, 2004.

BACKGROUND OF THE INVENTION

1. Field of the Invention

The present invention relates generally to semiconductor devices and related methods of manufacture. More particularly, the invention relates to semiconductor devices having a dual metal gate structure and related methods of manufacture.

2. Description of the Related Art

Constant demand for evermore densely integrated semiconductor devices, including the demand for semiconductor memory devices of constantly increasing capacity, has resulted in relentless pressure to reduce the size of the constituent components forming contemporary semiconductor devices. For example, the physical dimensions of nearly every constituent component in conventional Complementary Metal Oxide Semiconductor (CMOS) devices have been dramatically reduced over the past several years. This is particularly true of CMOS memory devices. However, despite the constant reduction in the physical dimensions of their constituent components, contemporary CMOS memory devices must nonetheless meet increasingly demanding performance criteria.

This ubiquitous "scaling down" of CMOS memory devices necessitates the use of ever more thin, yet performance criteria-compliant gate insulating (e.g., dielectric) layers. As the design rule for CMOS memory devices headed below 100 nm during the past decade, it has become increasingly apparent that the polysilicon gate structures conventionally used would no longer work with very thin gate insulating layers.

The use of polysilicon gate electrodes is a time honored one. Polysilicon is easy to deposit and pattern. It is not adversely affected by subsequently applied high temperature processes, and its "work function" is easily modified by selectively doping the polysilicon.

All conductive materials, including semiconductors, are characterized by a certain responsiveness to applied energy. This responsiveness is termed the material's "work function," and is usually expressed in electron volts (eV). This intrinsic quality of the material is defined by the minimum quantity of energy required to remove an electron from the Fermi level of the material in a vacuum. Different materials have different Fermi levels, different electron configurations, and thus require different amounts of applied energy to remove an electron.

In all materials, electrons arrange themselves in a hierarchy of energy states, first filling up the lower energy states before filling the higher energy states. The Fermi level for a particular material is associated with a highest occupied energy state for the material at zero temperature.

The Fermi level, and therefore the corresponding work function, for many undoped semiconductor materials like polysilicon is situated somewhere generally mid-way between the so-called conductance band of silicon (about 4.1 eV) and the valance band of silicon (about 5.2 eV). (This type of work function is referred to hereafter as "mid-bandgap.")

In contrast, conventional semiconductor materials have been selectively doped to produce either an N-type or a P-type material. N-type semiconductor materials have a Fermi level closer to the conduction band of silicon than to the valance band of silicon. P-type semiconductor materials have the opposite characteristic.

PMOS and NMOS type devices, such as transistors, are formed in great number in contemporary semiconductor devices. Each of these device types operationally benefits from a gate electrode having, respectively, P-type and N-type performance characteristics, including P-type and N-type work functions. Accordingly, conventional polysilicon CMOS gate electrodes are routinely doped with selected P-type and N-type impurities in order to modify ("adjust") the mid-bandgap work function of undoped polysilicon to levels more appropriately suited to (i.e., "compatible" with) PMOS and NMOS devices, respectively.

Unfortunately, when used with very thin gate insulating layers doped polysilicon gate electrodes experience undesirable voltage drops and unacceptable drive current requirements due to a well understood phenomenon called the gate depletion effect. Doped polysilicon gate electrodes may also experience high gate resistance, boron (B) penetration problems, and stability issues related to high-k gate dielectrics.

Beginning in the late 1990's, researchers proposed the use of metal gate electrodes as a replacement for the polysilicon gate electrodes previously used in CMOS devices. Various metals were identified as possible candidates for the formation of metal gate electrodes, including tungsten (W), titanium (Ti), tantalum (Ta), molybdenum (Mo), ruthenium (Ru), nickel (Ni), and niobium (Nb). Various metal compounds, metal nitrides, metal silicides, and metal oxides were also proposed for use in the formation of metal gate electrodes. (Hereafter, metal compounds, alloys, nitrides, silicides, and oxides are all subsumed in the term "metal" as it relates to the selection and formation of metal layer adapted for use in the fabrication of gate electrodes).

While certain types of metal gate electrodes experience some chemical and thermal stability issues, as compared with polysilicon gate electrodes, metal gate electrodes generally enjoy low gate resistance and do not suffer from the gate deletion effect. However, metal gate electrodes are significantly more difficult and complicated to fabricate. This is particularly true of etching process(es) used to pattern the metal layer. Such process(es) use chemicals that are difficult or dangerous to handle, use, and dispose of after use.

Given these enhanced processing difficulties, it is generally preferred to form only a single metal layer having a mid-bandgap work function from which PMOS and NMOS metal gate electrodes are subsequently formed. That is, manufacturing methods requiring multiple metal layer depositions and multiple corresponding etching steps are disfavored. However, it must be noted that some manufacturers have adopted a multiple metal layer deposition approach to the problem of providing PMOS and NMOS-compatible gate electrodes, despite the increased processing difficulties. Some companies feel that the ability to precisely select disparate metals for the formation of PMOS and NMOS gate electrodes allows maximum flexibility in the definition of work function and the selection of an operating threshold voltage (Vth) for the device incorporating the PMOS or NMOS gate electrode.

U.S. Pat. No. 6,130,123 to Liang et al. recognizes the utility of forming dual metal gate electrodes (i.e., PMOS and NMOS metal gate electrodes) from a single metal layer. Selected portions of the single metal layer are adjusted for PMOS and NMOS operation by adjusting their respective Fermi levels. Liang et al. propose in one example a method wherein selected portions of an N-type metal layer having a work function suitable for NMOS operation is exposed to a nitrogen-rich ($NH_3$ or $N_2$) ambient environment in order to change the work function of the exposed selected portions into a work function suitable for PMOS operation.

U.S. Pat. No. 6,483,151 to Wakabayashi et al. similarly suggests increasing the nitrogen content of selected portions of a titanium nitride layer to yield dual metal gate electrodes in a Metal Insulating Semiconductor Field Effect Transistor (MISFET). Here, however, nitrogen ion implantation is proposed as a replacement for the ambient atmosphere exposure suggested by Liang et al. U.S. Pat. No. 6,815,285 similarly uses nitrogen ion implantation to selectively modify the work function of a metal layer.

U.S. Pat. No. 6,537,901 to Cha et al. takes a slightly different direction. Cha et al. form separate metal layers under separate processing conditions to yield dual metal gate electrodes having disparate PMOS and NMOS compatible work functions. Here again, however, differing amounts of nitrogen ultimately define the respective work functions of both metal layers.

Japanese patent publication 2004-111549 in the name of Hiroyuki uses selective metal ion (nickel) implantation into a deposited metal layer (tantalum) to effect similar results. However, metal doping of metal to produce changes in the doped metal layer's work function is expensive and sometimes yields inconsistent results. As a result, conventional approaches to metal layer work function adjustment are dominated by nitrogen doping in one form or the other.

SUMMARY OF THE INVENTION

The conventional practices are too limited in their application and suffer from a certain amount of ambiguity in application. In contrast, the invention provides improved methods for adjusting the work function of a metal layer and corresponding semiconductor devices.

In one embodiment, the invention provides a method of manufacturing a semiconductor device. The method comprises forming a metal layer having a first work function and adjusting the work function of at least some selected portion of the metal layer by doping it with fluorine. Once doped with fluorine the selected portion has a second work function less than the first work function. Fluorine doping may be accomplished by any one of a number of methods including ion implantation. In one approach, an ion implantation process is used to produce a Gaussian concentration dopant profile.

The metal layer may be formed by any one of a number of methods including Physical Vapor Deposition (PVD), Chemical Vapor Deposition (CVD), or Atomic Layer Deposition (ALD).

In another embodiment, the invention provides method comprising; forming a metal layer having a first work function and adjusting the first work function in at least some selected portion of the metal layer by doping the selected portion with carbon. Once doped with carbon the selected portion has a second work function greater than the first work function.

In yet another embodiment, the invention provides a method in which an NMOS active region and a PMOS active region are first formed in a substrate and a gate insulating layer is formed on these regions. Thereafter, a metal layer having a first work function is formed on the gate insulating layer. The first work function is adjusted in a selected portion of the metal layer by doping the selected portion with either fluorine or carbon, such that the selected portion has a second work function different from the first work function.

In this context, the first work function may be PMOS-compatible and the selected portion of the metal layer is doped with fluorine to make the second work function NMOS-compatible, or the first work function is NMOS-compatible and the selected portion of the metal layer is doped with carbon to the make the second work function PMOS-compatible.

In yet another embodiment, the invention provides a method of forming a semiconductor device having a NMOS metal gate structure and a PMOS metal gate structure. The method comprises forming a single metal layer having an initial work function on a gate insulating layer and selectively adjusting the work function for a selected portion of the metal layer by doping the selected portion with either fluorine or carbon. In this manner, either the PMOS metal gate structure or the NMOS metal gate structure is formed from a first metal gate electrode formed from the selected portion of the metal layer, and the other one of the PMOS metal gate structure or the NMOS metal gate structure is formed from a second metal gate electrode formed from a portion of the metal layer other than the selected portion.

In still another embodiment, the invention provides a method comprising; forming an NMOS active region and a PMOS active region in a substrate, forming a gate insulating layer on the substrate to cover the NMOS active region and the PMOS active region, and forming a metal layer having a mid-bandgap work function on the gate insulating layer. The work function in a first selected portion of the metal layer formed on the NMOS active region is then doped with fluorine such that the first selected portion has a NMOS-compatible work function, and adjusting the work function in a second selected portion of the metal layer formed on the PMOS active region by doping the second selected portion with carbon such that the second selected portion has a PMOS-compatible work function.

In still another embodiment, the invention provides a semiconductor device comprising a NMOS metal gate structure comprising a first metal gate electrode formed from a metal layer and doped with fluorine to have a first work function, and/or a PMOS metal gate structure comprising a second metal gate electrode formed from the metal layer and doped with carbon to have a second work function greater than the first work function.

BRIEF DESCRIPTION OF THE DRAWINGS

The invention is described in relation to several embodiments illustrated in the accompanying drawings. Throughout the drawings, like reference numbers indicate like exemplary elements, components, or steps. The relative thickness for various layers as well as the relative size of specific regions has been exaggerated for clarity. In the drawings:

Figure (FIG.) 1 is a graph comparing the resulting work functions of an exemplary tantalum nitride (TaN) metal layer formed by respective Physical Vapor Deposition (PVD), Chemical Vapor Deposition (CVD), and Atomic Layer Deposition (ALD) processes;

FIGS. 6A, 6B, and 6C are a sequence of views illustrating another exemplary application and embodiment of the invention; and, FIGS. 7A, 7B, 7C, 7D and 7E are a sequence of views illustrating yet another exemplary application and embodiment of the invention.

DESCRIPTION OF THE EXEMPLARY EMBODIMENTS

Figure 1:
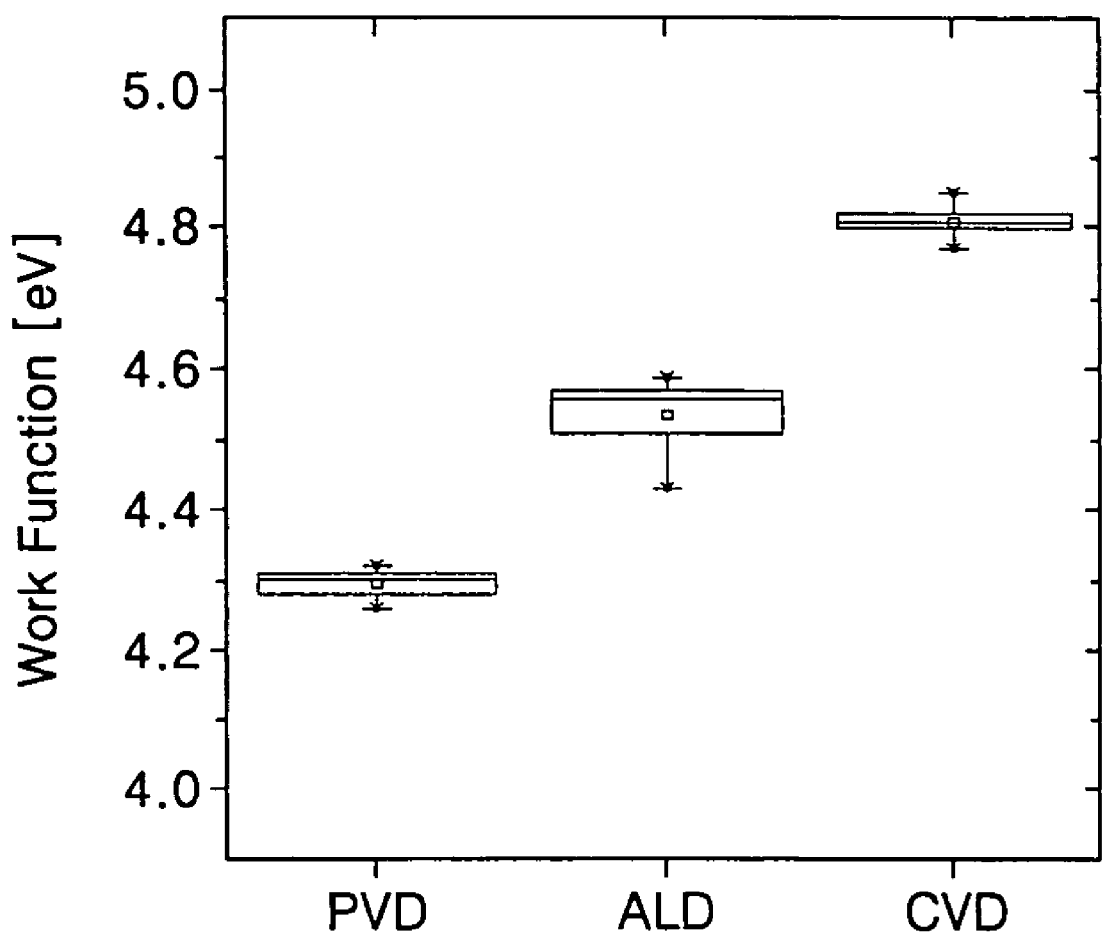

Exemplary embodiments of the invention are described below with reference to the corresponding drawings. These embodiments are presented as teaching examples. The actual scope of the invention is defined by the claims that follow. Those of ordinary skill in the art will appreciate that the term "on" as used in relation to the formation of various semiconductor layers and regions describes a relationship in which one layer/region is directly on another, or in which the one layer/region is on another, but one or more intervening layers and/or regions separate the two layer/regions.

Among other aspects, the exemplary embodiments of the invention described below illustrate the formation and composition of dual metal gate structures, and related constituent metal gate electrodes. The term "dual" in this context refers to separate gate structures adapted for use with different transistor types. Transistors used in the formation of semiconductor devices are classified as being NMOS or PMOS is relation to the type of main carrier migrating through their channel region. Electrons are the main carriers in a NMOS transistor, while holes are the main carriers in a PMOS transistor. The work function of a PMOS gate electrode in a PMOS transistor is higher than that of a NMOS gate electrode in a NMOS transistor. The transistor structures adapted to the benefits of the invention use one or more metal layer(s) to form respective PMOS and NMOS gate electrodes.

The conceptual basis for the invention finds root in several interrelated recognitions. First, the conventional techniques described above generally use nitrogen doping to selectively adjust the work function of a metal layer. Nitrogen doping of a metal layer, whether by exposure to a nitrogen rich atmosphere or by ion implantation of nitrogen atoms, has a limited range of utility. The process and effects of nitrogen doping are often difficult to determine since nitrogen tends to be a common process contaminant.

Second, recent research has suggested a generic relationship between the relative electronegativity of metal dopants and a resulting metal layer work function. Consider, for example, the work of Gotoh et al., in *Measurements of work function of transition metal nitride and carbide thin films*, J. Vac. Sci. Technolo. B 21(4), pp. 1607-11, July/August 2003. Here, is was observed that, "[t]he work function of TaC was approximately 5.0 eV. The higher work function of carbide may be attributed to lower electronegativity of carbon as compared to nitrogen." Gotoh et al., continue, "[t]he deviation of the work function from pure metal should be caused by the polarization between the metal atom and the interstitial atom. If the interstitial atom has a larger electronegativity, the metal atoms would be positively charged. This may cause a reduction in the work function." Ultimately, Gotoh et al., conclude, "[t]he work function of the group V carbide was higher than that of the group V nitride."

Third, the foregoing observations have been widely misunderstood. Consider, for example, published U.S. Patent Application 2004/0222474 which reaches the very erroneous conclusion that adding "a significant quantity of a material with a relatively high electronegativity will raise the work function of a metal layer, while adding a [ ] significant quantity of a material with a relatively low electronegativity will lower the work function of [the] metal layer." Aluminum and cerium are proposed in this document as preferred elements for reducing the work function of a metal layer. Nitrogen, chlorine, oxygen, fluorine, and bromine are proposed as preferred elements for increasing the work function of a metal layer.

Fourth, the definition of work function for a metal layer is not simply a matter of selecting a dopant. Rather, the type of metal used to form the metal layer, formation method used to form the metal layer, and the process conditions under which the metal layer is formed are all relevant to the proper definition of the ultimate work function.

With these recognitions in mind, consider the variations in the initial work function of a tantalum nitride (TaN) layer formed by three (3) exemplary formation methods illustrated in FIG. 1. Experimental date is presented here for tantalum nitride, however this is but one convenient example of a possible metal layer. As already noted many metal layer compositions are possible, and each different metal layer will exhibits an initial work function that varies with the formation method used to form it. The phrase "initial work function" describes the work function for a metal layer following its formation, but before subsequent doping processes specifically designed to change its work function.

In FIG. 1, the initial work function for the TaN layer is about 4.3 eV where a Plasma Vapor Deposition (PVD) formation method is used. PVD is an excellent choice where a designer desires a metal layer having minimal and well controlled contaminants. That is, impurities in a PVD deposited metal layer tend to be relatively uniform and low in concentration. These qualities are desirable where a designer envisions that subsequently applied doping processes will largely control the definition of work function for the metal layer. However, thickness control can be an issue with many PVD processes, and as a result it is often difficult to obtain thin, accurately defined metal layers.

As shown in FIG. 1, the initial work function for the TaN layer is about 4.5 eV where a Atomic Layer Deposition (ALD) formation method is used. ALD processes produce beautiful, exceptionally well-controlled, thin metal layers, but very slowly. This slow deposition speed can be a practical issue in large scale manufacturing operations.

The initial work function for the TaN layer is about 4.8 eV where a Chemical Vapor Deposition (CVD) formation method is used. CVD processes are cheap, fast, and easy. Thickness control is good, but impurity accumulation in the resulting metal layer must be carefully considered.

Figure 2A:
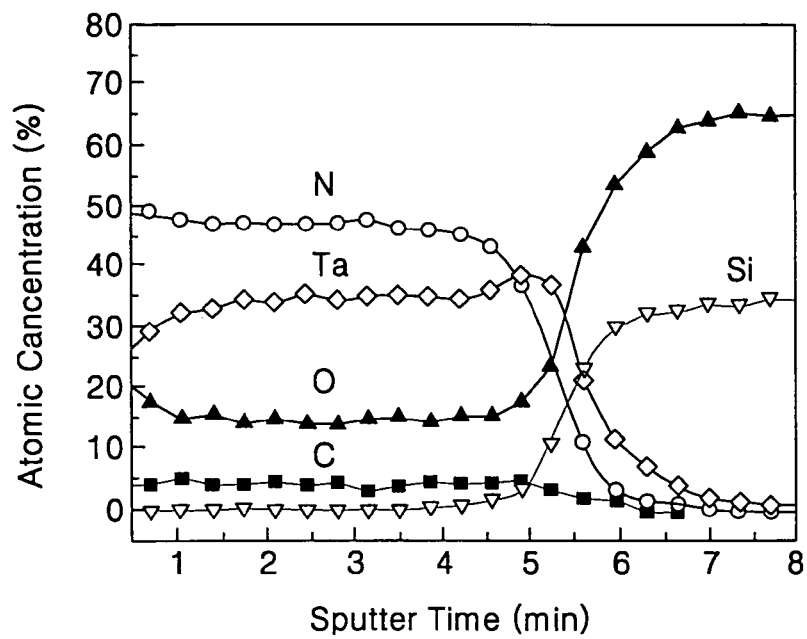
FIGS. 2A and 2B are graphs illustrating variations in impurity concentrations as a function of exemplary metal layer deposition processes.
Figure 2B:
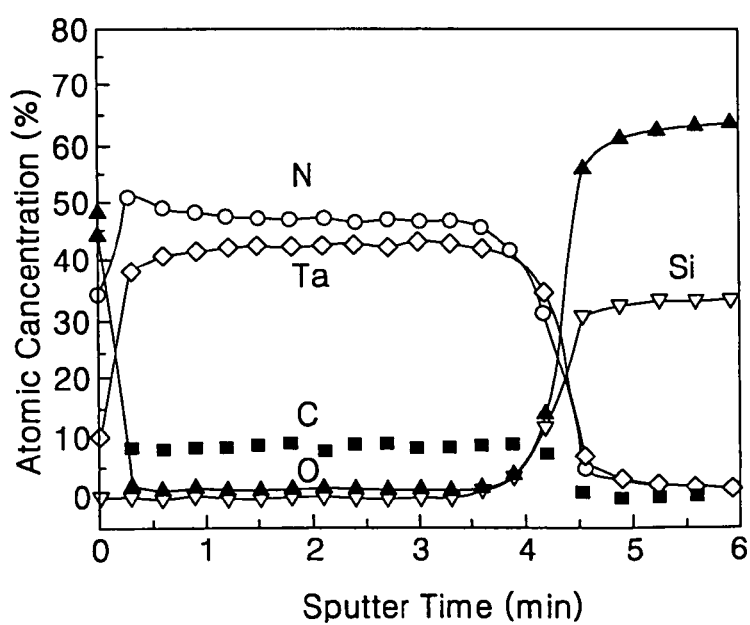

As can be seen from the foregoing example, selection of a metal layer formation (e.g., deposition) method is relevant to the definition of an initial (and therefore an ultimate) work function for the metal layer. So too, the selection of related processing conditions is also relevant. Consider FIGS. 2A and 2B which are graphs showing AES (Auger Electron Spectroscopy) analysis results for two different metal layer formation methods over a range of processing time periods. The atomic concentrations for certain impurities are expressed as a function of sputter time (i.e., processing time). FIG. 2A graphs impurity concentrations for an ALD process forming a TaN metal layer. FIG. 2B graphs impurity concentrations for an CVD process forming a TaN metal layer.

If we consider the results after three (3) minutes, carbon (C) is found at a 4.2% atomic concentration and oxygen (O) is found at a 14.2% concentration for the ALD process. In contrast, the atomic concentrations for carbon and oxygen after three (3) minutes of the CVD process are 8.7% and 1.2% respectively.

As will be seen in additional detail hereafter, the relative concentrations of certain impurities in the resulting metal layer must be carefully considered in the definition of work function. In this context, impurity concentrations are not necessarily a bad or a good thing—only one factor that must be accounted for during the definition of a metal layer's initial work function.

As is well understood, subsequent thermal processing (e.g., heat treatment) of the metal layer may drive out certain impurities, and thereby alter its work function, as well as its sheet resistance (Rs). Consider the exemplary data shown in FIGS. 3A and 3B. This data continues with the former working example of a TaN metal layer formed using a CVD process.

Figure 3A:
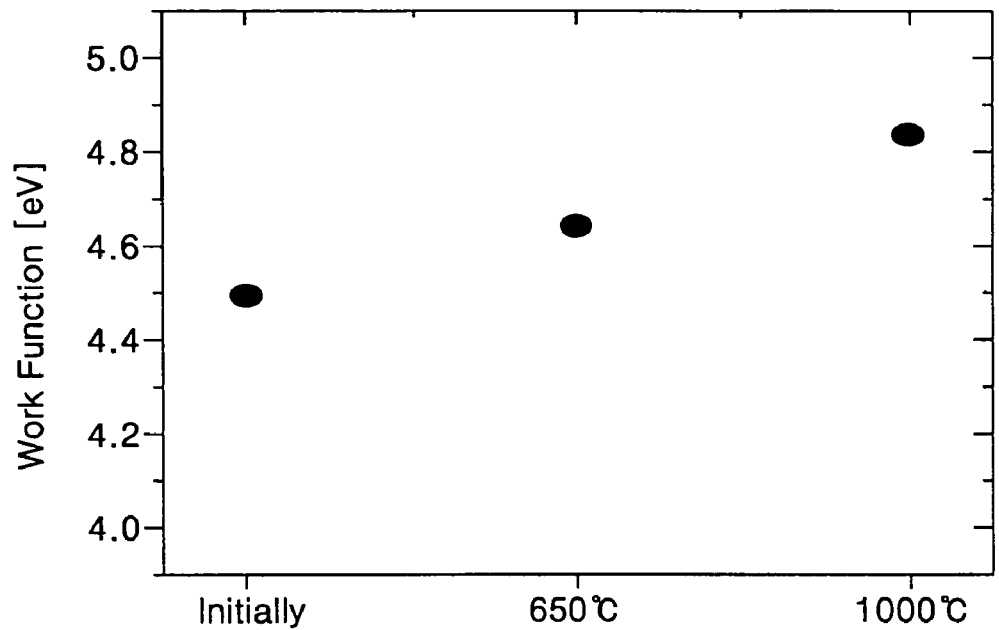
FIGS. 3A and 3B are graphs illustrating variations in an initial metal layer work function over a range of processing conditions, namely an applied heat treatment.
Figure 3B:
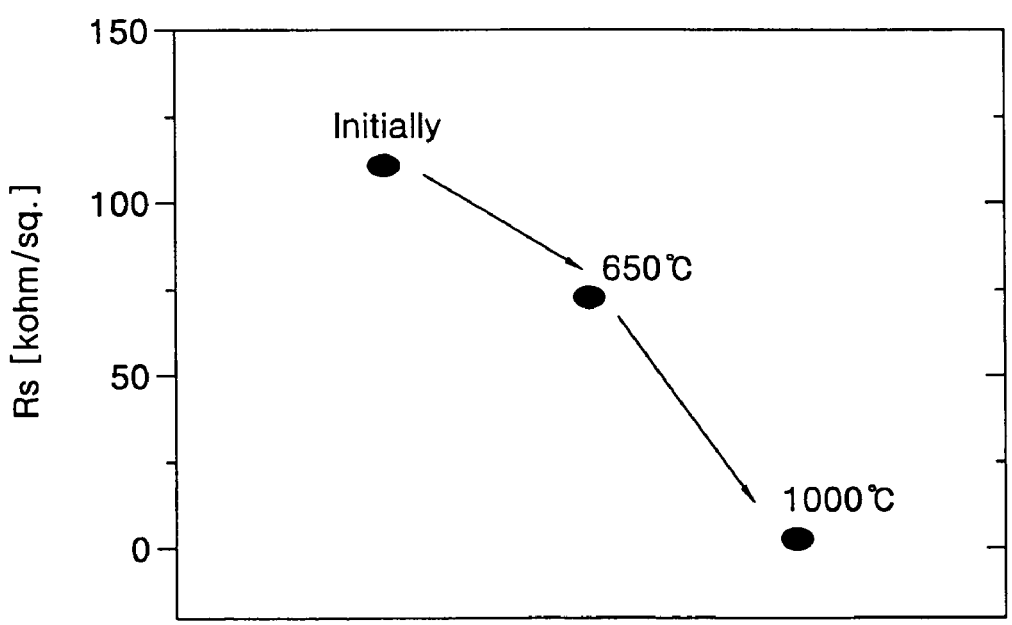

As shown in FIGS. 3A and 3B, heat treatment of the TaN metal layer tends to drive out (i.e., out diffuse) oxygen atoms from the metal layer, and thereby increase work function and decrease sheet resistance. It is desirable in the context of most contemporary semiconductor devices that any metal layer used to form the dual metal gate electrodes be highly tolerant of processing temperatures up to 1000° C. This general tolerance for high temperature allows the metal layer to survive a range subsequently applied processing steps without loss or material variance of performance capabilities.

The foregoing examples showing work function variations in accordance with metal layer formation methods and processing conditions may readily be extrapolated across a number of different metal layer types, formation methods, and range of processing conditions. A firm understanding of the initial work function resulting from a careful balancing of these factors, among others, is required before the doping considerations of the invention may be effectively used.

In several exemplary embodiments, the invention seeks to use a single thin metal layer in the formation of dual metal gate electrodes. Use of a single metal layer minimizes process complexity.

As will be understood upon consideration of the exemplary embodiments, the invention draws upon and extends the earlier observations regarding the potential relationship between the relative electronegativity of interstitial atoms and the resulting work function of a metal layer. In so doing, the invention flatly rejects the teachings of certain prior publications that reach a directly contrary conclusion.

The invention recognizes that nitrogen and oxygen are impurities commonly found in deposited metal layers. Nitrogen in particular, given its prevalence in the ambient atmosphere and its susceptibility to inclusion as a shallow donor within conductive or semiconductive materials, is widely present in metal layers. As a result, conventional approaches which selectively dope a metal layer with more nitrogen to adjust its work function run the risk of loosing nitrogen dopant trees amongst the nitrogen contamination forest, so to speak.

With the foregoing in mind, embodiments of the invention variously provide a metal layer selectively doped with either carbon (C) or fluorine (F) to adjust the initial work function of the metal layer. These embodiments rely on the conclusion that doping with carbon (which has a relatively low electronegativity) tends to increase the work function of a metal layer, and doping with fluorine (which has a relatively high electronegativity) tends to decrease the work function of a metal layer.

Figure 4:
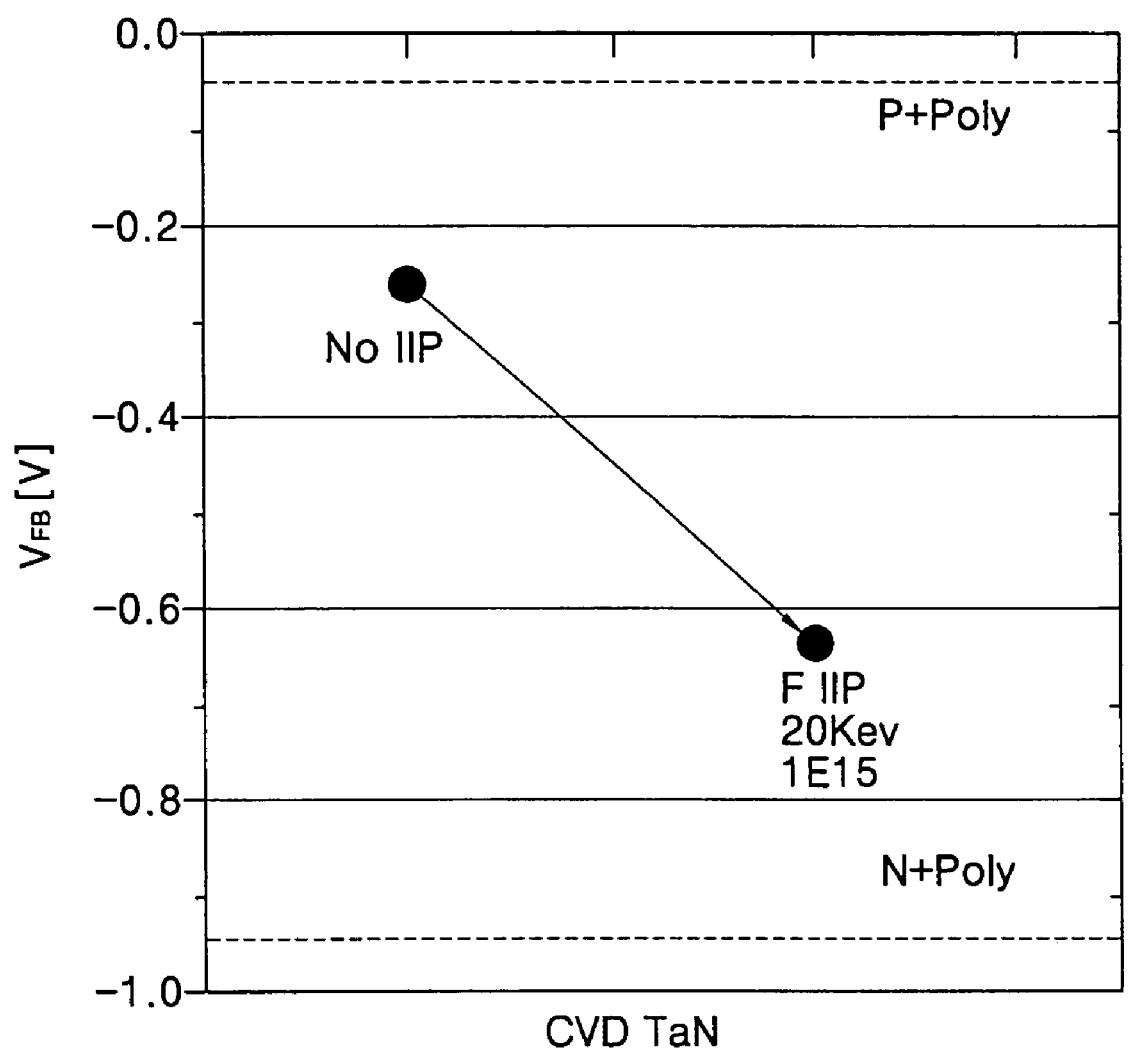
FIG. 4 is a graph illustrating an adjustment in metal layer work function as a result of fluorine doping.

Consider, for example, the experimental data shown in the graph of FIG. 4. Here, the CVD deposited TaN metal layer used as a working example throughout the discussion of FIGS. 1-3 is further modified by doping it with fluorine atoms. In particular, a 40 Å thick TaN metal layer is ion implanted ("IIP") with a concentration of 1 E15 fluorine atoms. The work function (WF) of the TaN metal layer may be defined by the equation $WF=V_{FB}+5.0$ eV, where $V_{FB}$ is termed a flat banded voltage. Hence, before ion implantation with fluorine atoms ("No IIP"), the TaN metal layer's work function is around 4.75 eV—a very respectable PMOS-compatible work function. After ion implantation with fluorine atoms ("F IIP"), the TaN metal layer's work function is around 4.35 eV—a very respectable NMOS-compatible work function.

Fluorine has a relative electronegativity of 4.0 and metal layers doped with fluorine atoms will exhibit a decreased work function. In contrast, carbon has a relative electronegativity of 2.5 and metal layers doped with carbon atoms will exhibit an increased work function. With this understanding in mind, a metal layer having an initial PMOS-compatible work function (i.e., a work function ranging from about 4.7 to about 5.0 eV) may be adjusted in selected portions to form NMOS-compatible work function (i.e., a work function ranging from about 4.3 to about 4.5 eV) by doping the metal layer with fluorine. Alternatively, a metal layer having an initial NMOS-compatible work function may be selectively adjusted to form portions of the metal layer having a PMOS-compatible work function by doping the metal layer with carbon. In this manner, dual work function metal gate electrodes may be formed from a single metal layer using as few as a single doping process.

Figure 5A:
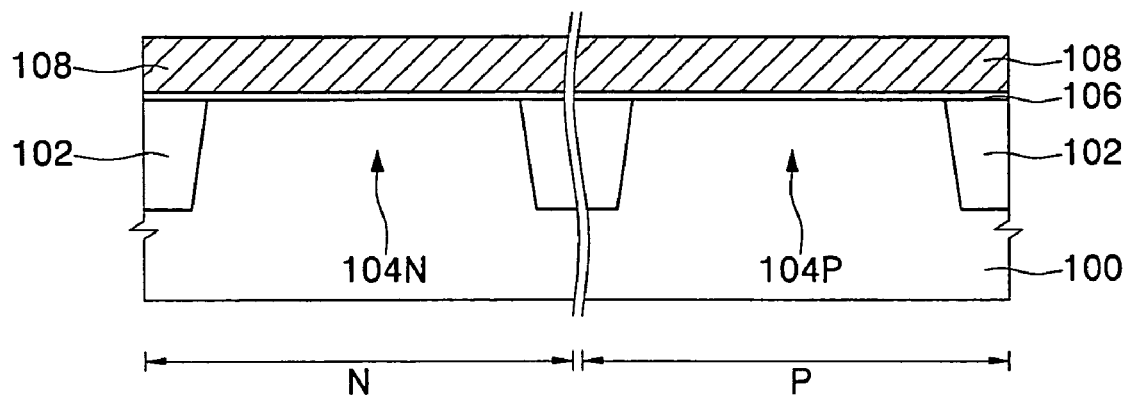
FIGS. 5A, 5B, 5C and 5D are a sequence of views illustrating one exemplary application and embodiment of the invention.
Figure 5B:
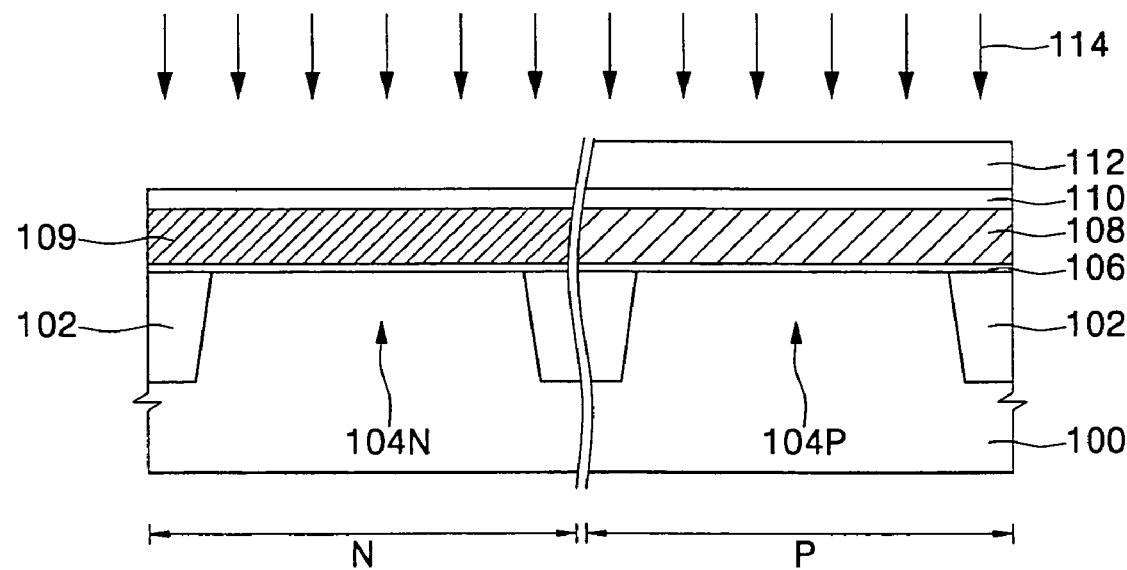
Figure 5C:
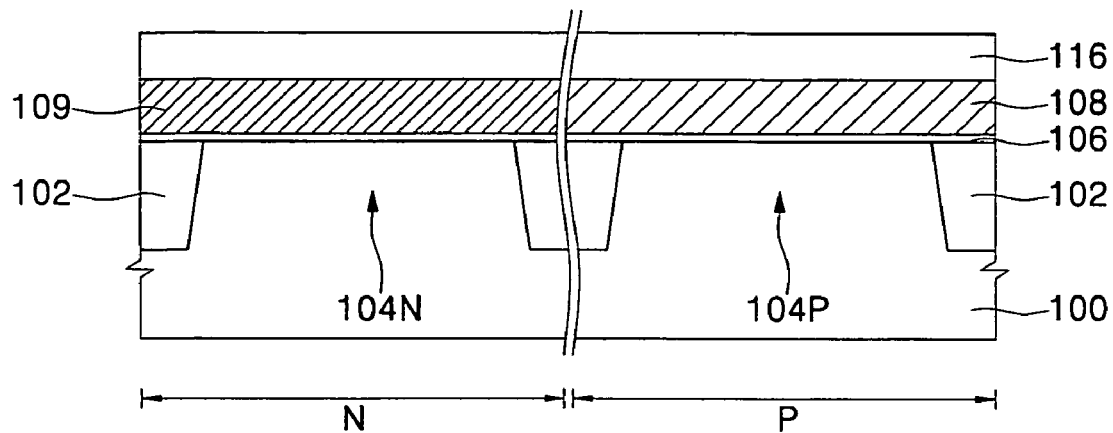
Figure 5D:
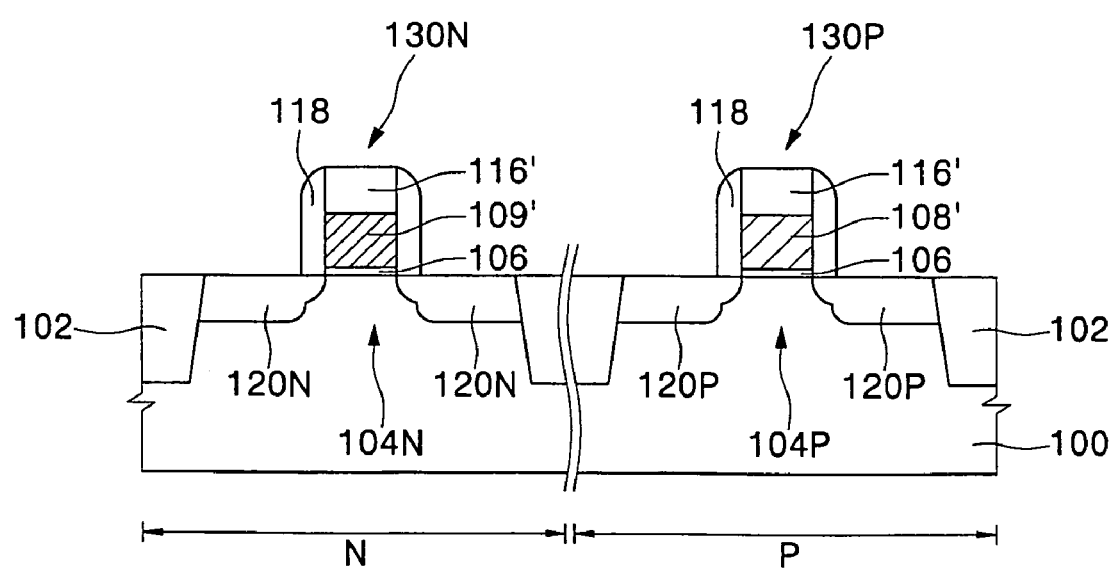

FIGS. 5A, 5B, 5C and 5D (collectively, "FIG. 5") illustrate application of the foregoing concepts during formation of an exemplary semiconductor device. Beginning with FIG. 5A, isolation regions 102 are selectively formed in a substrate 100. Substrate 100 may be formed from bulk silicon or a silicon-on-insulator combination. Substrate 100 may also comprise one or more regions doped with, as selected examples but without being limiting, germanium, gallium, gallium arsenide, gallium antimonide, indium antimonide, indium arsenide, and indium phosphide. Isolation regions 102 may be formed using one of many conventionally available techniques.

Following formation of isolation regions 102, an NMOS active region 104N and a PMOS active region 104P are formed in substrate 100. Thereafter, gate insulting layer 106 is formed on substrate 100. Gate insulating layer 106 is preferably a high-k gate dielectric layer.

Metal layer 108 is then formed on gate insulating layer 106. The term "metal layer" encompasses any conductive material from which a competent metal gate electrode may be formed. As noted above, the term "metal" specifically includes metal compounds, metal alloys, metal nitrides, metal silicides, metal oxides and all possible combinations of same.

In the embodiment illustrated in FIG. 5, metal layer 108 is characterized by a PMOS-compatible work function. Specific metals well adapted to the formation of this PMOS-compatible metal layer comprise, for example, nickel (Ni), ruthenium oxide (RuO), molybdenum nitride (MoN), tantalum nitride (TaN), molybdenum silicide ($MoSi_2$), and/or tantalum suicide ($TaSi_2$).

A buffer layer 110 formed from polysilicon and/or silicon dioxide ($SiO_2$), as examples, may be provided on metal layer 108. Buffer layer 110 may be provided to protect portions of metal layer 108 during subsequently applied processes.

Using conventional techniques, a mask pattern (e.g., a photoresist pattern) 112 is then formed on metal layer 108. With an appropriate mask pattern in place, selected portions of metal layer 108 are implanted with fluorine (F) atoms (114). The concentration of fluorine atoms as well as the implantation conditions (energy, temperature, pressure, etc.) for this process will vary in accordance with the material composition, the initial work function (as defined by the deposition process used and the deposition conditions), and thickness of metal layer 108. However, in one embodiment, the selected ion implantation process is adapted to produce a Gaussian dopant concentration profile.

The fluorine doped selected portion 109 of metal layer 108 is formed on the NMOS active region 104N. Following implantation of the fluorine atoms, mask pattern 112 may be removed.

Since metal layer 108 is relatively difficult to etch, it is preferably formed, at least in some embodiments, with a relatively thin thickness (e.g., less than 100 Å). This thickness is generally insufficient to allow connection of the gate electrode to an external signal line. This relatively thin thickness also precludes the use of certain processes adapted to the formation of source and drain regions around the gate electrode structure. Accordingly, the thickness (i.e., the height profile) of the completed gate electrode must often be increased. This may be accomplished in one embodiment by forming an additional conductive layer 116 on metal layer 108 including fluorine-doped selected portions 109. See, FIG. 5C. Additional conductive layer 116 may comprise; polysilicon, a refractory metal and/or a refractory metal silicide, as selected examples.

Using conventional and well understood techniques and processes, metal layer 108 including fluorine-doped selected portions 109, along with additional conductive layer 116, where provided, are patterned to form completed NMOS and PMOS gate electrode structures, 130N and 130P. See, FIG. 5D. NMOS gate electrode structure 130N generally comprises in the illustrated example, a stacked structure comprising a patterned portion of gate insulating layer 106, a patterned portion of selected portion 109', a patterned portion of additional conductive layer 116' and gate spacers 118 formed on sidewalls of the stacked structure. PMOS gate electrode structure 130P comprises in the illustrated example, a stacked structure comprising a patterned portion of gate insulating layer 106, a patterned portion of metal layer 108', a patterned portion of additional conductive layer 116' and gate spacers 118 formed on sidewalls of the stacked structure. Following the formation of the NMOS and PMOS gate electrode structures, respective source and drain regions are formed in substrate 100. See, elements 120N and 120P in FIG. 5D, respectively.

FIGS. 6A, 6B and 6C (collectively, "FIG. 6") further illustrate application of the foregoing concepts during formation of another exemplary semiconductor device. As illustrated in FIG. 6A, substrate 100, isolation regions 102, NMOS active region 104N, PMOS active region 104P, and gate insulating layer 106 are formed as described above in relation to FIG. 5. Metal layer 208 is then formed on gate insulating layer 106.

In the embodiment illustrated in FIG. 6, metal layer 208 is characterized by a NMOS-compatible work function. Specific metals well adapted to the formation of this NMOS-compatible metal layer comprise, for example, ruthenium (Ru), tantalum (Ta), zirconium (Zr), and niobium (Nb).

Buffer layer 110 may again be provided on metal layer 208, and a mask pattern 212 is then formed on metal layer 208. With an appropriate mask pattern in place, selected portions of metal layer 208 are implanted with carbon atoms (214). Again, the concentration of carbon atoms as well as the implantation conditions (energy, temperature, pressure, etc.) will vary in accordance with the material composition, the initial work function (as defined by the deposition process used and the deposition conditions), and thickness of metal layer 208.

The carbon doped selected portion 209 of metal layer 208 is formed on the PMOS active region 104P. Following implantation of the carbon atoms, mask pattern 112 may be removed. An additional conductive layer 116 may again be formed as in the foregoing embodiment in situations where additional height for the resulting gate electrode is desired.

As shown in FIG. 6C, metal layer 208 including carbon-doped selected portion 209, along with additional conductive layer 116, where provided, and the gate insulating layer 106 are then patterned in preparation for the completion of NMOS and PMOS gate electrode structures, 230N and 230P. Thus, NMOS gate electrode structure 230N generally comprises in the illustrated example, a patterned portion of gate insulating layer 106, a patterned portion of metal layer 208', a patterned portion of additional conductive layer 116', and sidewalls 118. PMOS gate electrode structure 230P comprises in the illustrated example, a patterned portion of gate insulating layer 106, a patterned portion of selected portion 209', a patterned portion of additional conductive layer 116', and sidewalls 118.

Figure 7A:
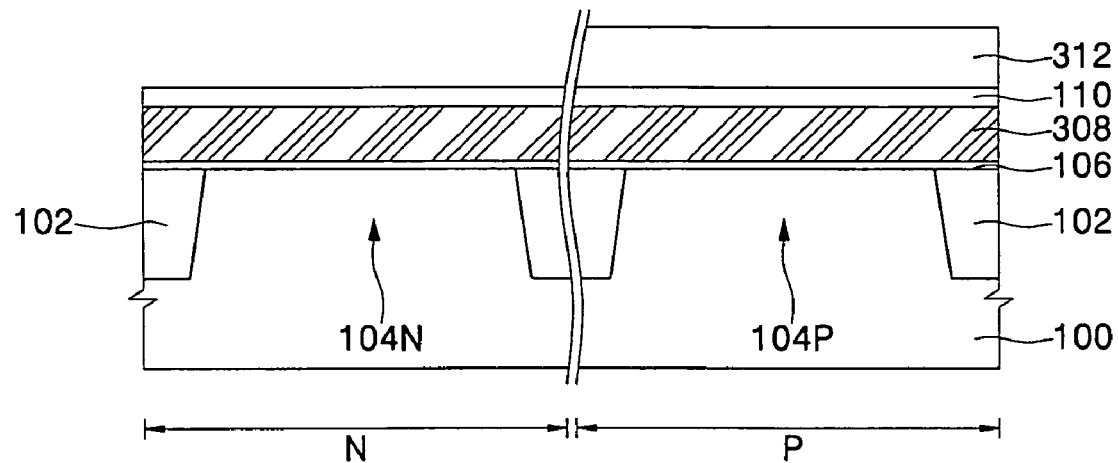

FIGS. 7A, 7B, 7C, 7D and 7E (collectively, "FIG. 7") still further illustrates application of the foregoing concepts during formation of yet another exemplary semiconductor device. As shown in FIG. 7A, the formation of substrate 100, isolation regions 102, NMOS active region 104N, PMOS active region 104P, and gate insulating layer 106 follows from the discussion presented in the context of FIG. 5. Metal layer 308 is then formed on gate insulating layer 106.

In the embodiment illustrated in FIG. 7, a single metal layer 308 is characterized by a work function consistent with the intrinsic Fermi level of undoped silicon. This "mid-bandgap-compatible" work function generally ranges between 4.4 and 4.7 eV. Specific metals well adapted to the formation of a mid-bandgap-compatible metal layer comprise, for example, tungsten nitride (WN) and titanium nitride (TiN).

Figure 7B:
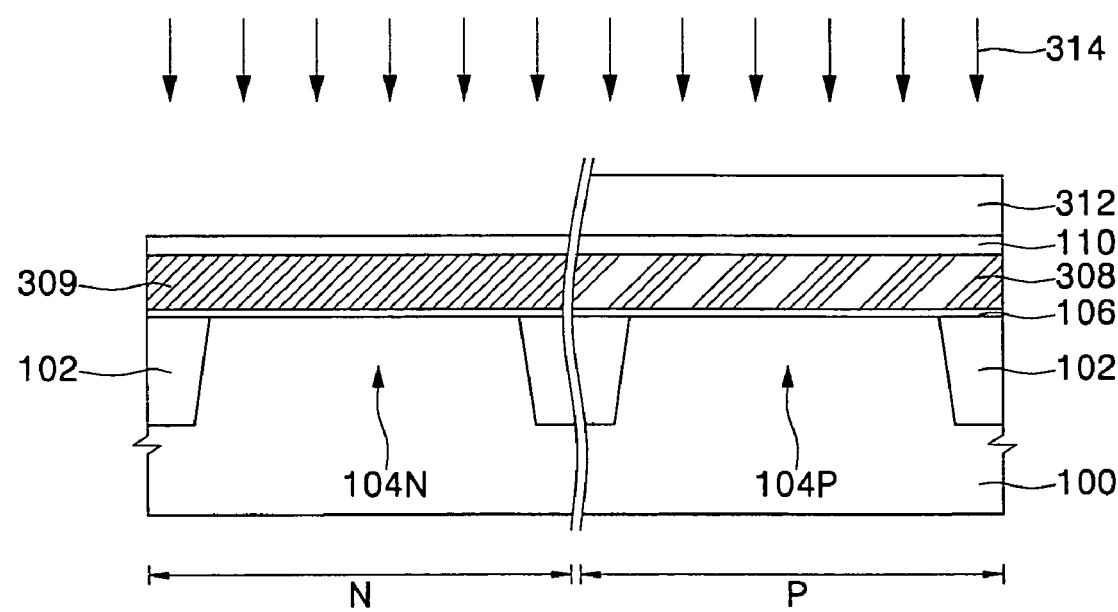
Figure 7C:
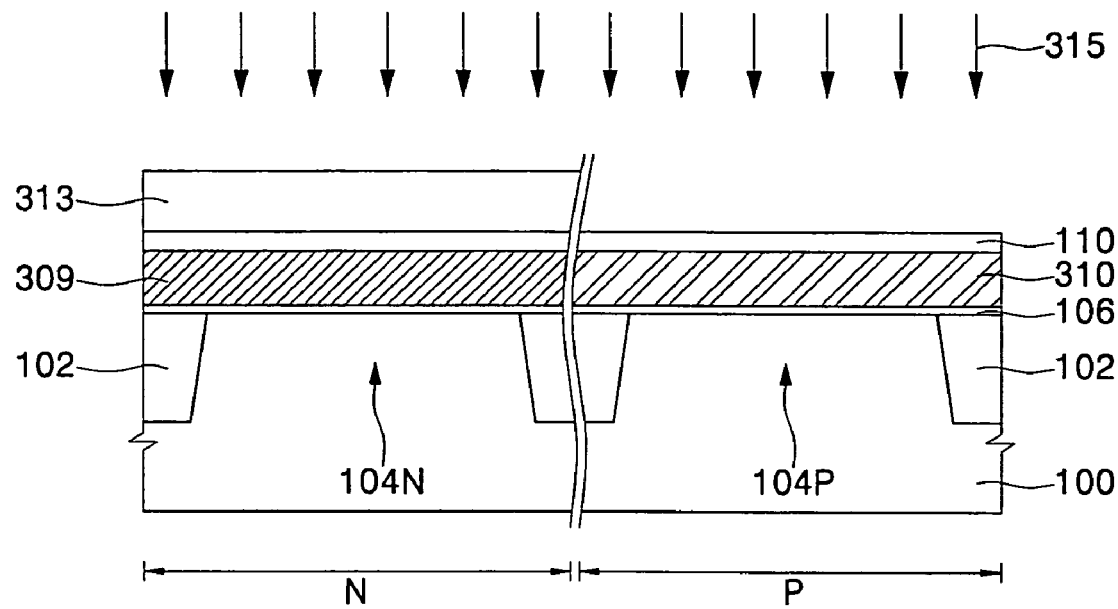

Buffer layer 110 may again be provided on metal layer 308. With or without the addition of buffer layer 110, a first mask pattern 312 is formed on either a portion of metal layer 308 associated with NMOS active region 104N or another portion of metal layer 308 associated with PMOS active region 104P. For example, as illustrated in FIG. 7B, PMOS active region 104P is covered by first mask layer 312. Fluorine atoms are then implanted (314) into a first selected portion of metal layer 308 associated with NMOS active region 104N. Consistent with the foregoing discussion, fluorine-doped metal region 309 is characterized by a NMOS-compatible work function.

After development of this first selected portion of metal layer 308, first mask layer 312 is removed and a second mask pattern 313 is formed on substrate 100 covering NMOS active region 104N. Carbon atoms are then implanted (315) in the exposed, second selected portion of metal layer 308 associated with PMOS active region 104P. See, FIG. 7C. Carbon-doped metal layer 310 is characterized by a PMOS-compatible work function.

Figure 7D:
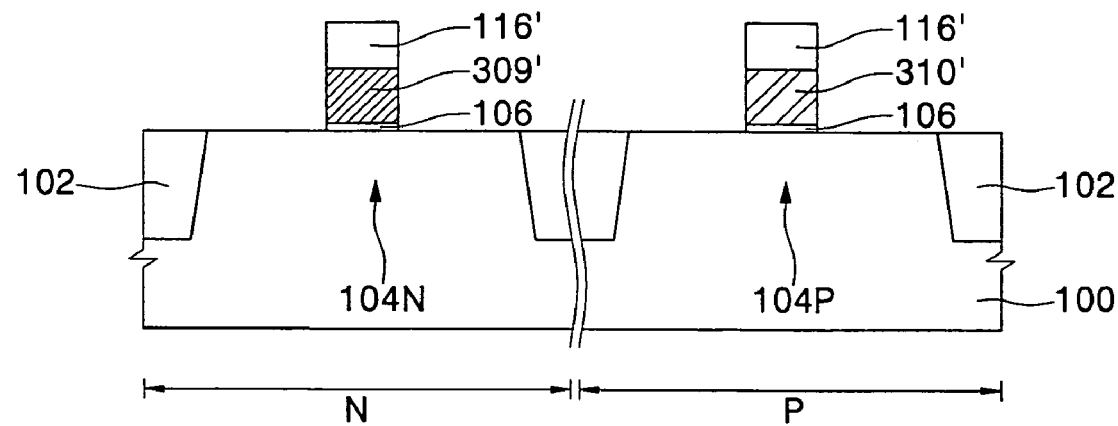
Figure 7E:
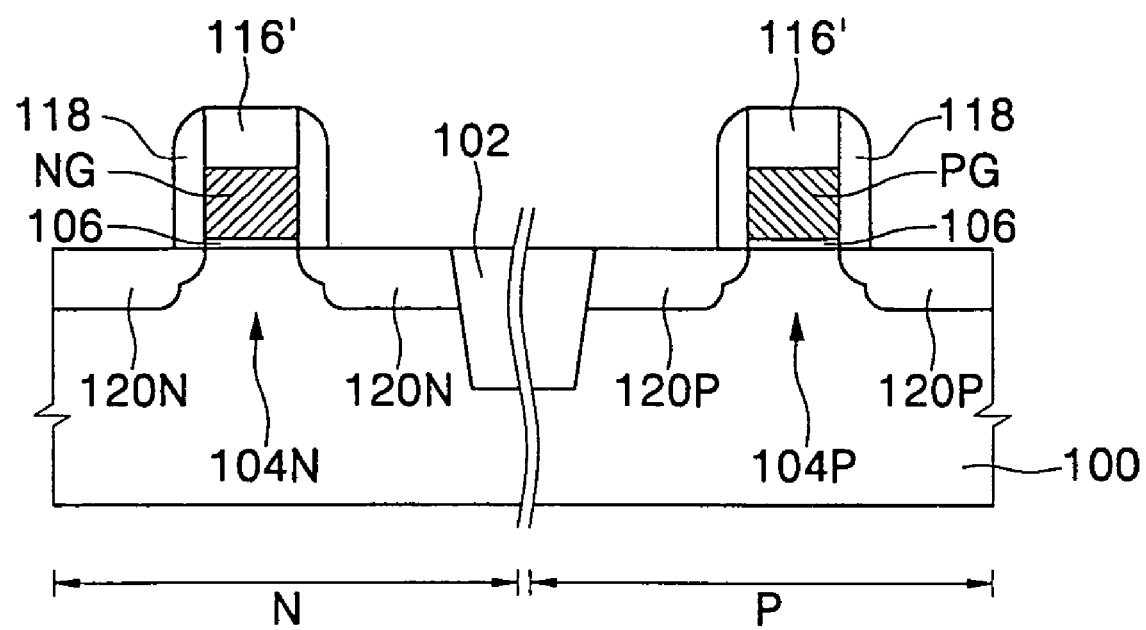

As illustrated in FIGS. 7D and 7E, following the formation of selected fluorine-doped and carbon-doped portions of metal layer 308, NMOS and PMOS gate electrode structures are formed using conventional patterning and implantation techniques. As can be seen in FIG. 7D, gate insulating layer 106, fluorine-doped (first) selected portion of metal layer 309 and carbon-doped (second) selected portion of metal layer 310, along with additional conductive layer 116 are then appropriately patterned (designated 309', 310' and 116' respectively) preparatory to the formation of NMOS and PMOS gate electrode structures.

In FIG. 7E, gate electrode structure sidewalls 118 and respective source and drain regions are formed in substrate 100 for NMOS and PMOS transistors, respectively 120N and 120P.

The relationship between sidewall geometry and the formation of source and drain regions in substrate 100 is well understood conventionally. Indeed, one reason for the formation of a gate electrode structure having a sufficient height is the subsequent formation of sidewalls having sufficient thickness. Many conventional ion implantation techniques used to form transistor source and drain regions rely on sidewall thickness to properly localize ion implantation. Hence, some embodiments of the invention will require either a thick metal layer, or an one or more additional conductive layer(s) formed on a thin metal layer. The later of these two possibilities is preferred since metal is generally more difficult to etch than additional conductive layers form from polysilicon, for example.

With all of the foregoing in mind, one may see that dual metal gate electrodes may be formed with any reasonable work function from a single metal layer. Multiple metal layer depositions and patterning are not required. As a result, the overall manufacturing process used to produce semiconductor devices incorporating dual metal gate structures is made simpler and less expensive. As carbon atoms have a smaller electronegativity than nitrogen and fluorine atoms have a higher electronegativity than nitrogen, the selective use of one or both of these dopants provides an enhanced ability to either increase or decrease the work function of a metal layer over the use of nitrogen alone.

Yet, tactical doping of a metal layer with carbon and/or fluorine is just one (final or near final) step in the calculated definition of a metal layer work function. A first practical step in the definition of a metal layer work function is selection of a particular constituent metal. This selection will be made from a broad range of possible metals. Some applications, devices, or existing cost and/or processing constraints may limit a designer's choice of metal. Still other applications and designs will allow great latitude in the choice of a metal.

As a particular metal is being selected, possible formation (e.g., deposition) methods well adapted to the deposition of the prospective metal should also be considered, as well as related processing conditions (such as heat treatment, for example). A careful designer will balance these factor among other design drivers to define an initial work function for the anticipated metal layer. The initial work function may be NMOS-compatible, PMOS-compatible, or mid-bandgap-compatible. The narrowness or flexibility in the range of the desired initial work function is also the subject of design choice, and may be limited (or not) by the designer's ability to dope the metal layer with practical concentrations of carbon and/or fluorine.

As has also been discussed, metal layer thickness is another important design criteria. It influences the choice (or requirement) of a subsequent etching process adapted to pattern the metal layer. It also influences the use (or not) of an additional conductive layer. The metal layer thickness also defines the nature and quality of the carbon and/or fluorine implantation process(es). For example, different metal layer thicknesses require different dopant concentrations and different implantation energies.

In this regard, the foregoing embodiments have been described in the context of carbon and fluorine implantation processes. Ion implantation is presently preferred as a method of doping a metal layer since it offers precision placement of dopant atoms and excellent control over dopant concentrations. Yet, other doping techniques (e.g., insitu metal layer doping during the deposition process, exposure to a dopant rich atmosphere, etc.) might alternatively or additionally be used, so long as appropriate work function(s) can be developed for selected portion(s) of a metal layer.

Generic transistor structures have been used to teach the making and use of dual metal gate structures having gate electrodes with NMOS- and PMOS-compatible performance characteristics. Those of ordinary skill in the art will be able to extend these teachings to a multiplicity of specific transistor types formed on a wide variety of substrate types and gate insulting layers.

Indeed, those of ordinary skill will appreciate that the broad concepts of the invention may be modified and adapted to many applications and designs without departing from the scope of the invention which is defined by the attached claims.

What is claimed is:

1. A method, comprising:
   forming a metal layer having a first work function;
   adjusting the work function of a selected portion of the metal layer by doping the selected portion with fluorine (F), such that the work function of the selected portion of the metal layer is reduced to a second work function less than the first work function as a function of the doping with fluorine.

2. The method of claim 1, wherein doping the selected portion of the metal layer with fluorine comprising selectively implanting fluorine atoms.

3. The method of claim 1, wherein the first work function ranges from between about 4.7 to 5.3 eV, and wherein the second work function ranges from between about 3.7 to 4.5 eV.

4. The method of claim 3, wherein the first work function ranges from between about 4.7 to 5.0 eV, and wherein the second work function ranges from between about 4.3 to 4.5 eV.

5. The method of claim 1, wherein the metal layer comprises at least one of nickel (Ni), ruthenium oxide (RuO), molybdenum nitride (MoN), molybdenum silicide ($MoSi_2$), tantalum silicide ($TaSi_2$), and tantalum nitride (TaN).

6. The method of claim 1, wherein forming the metal layer comprises depositing the metal layer on the substrate using a Physical Vapor Deposition (PVD) process, a Chemical Vapor Deposition (CVD) process, or an Atomic Layer Deposition (ALD) process.

7. The method of claim 6, wherein the metal layer comprises tantalum nitride, and wherein forming the metal layer comprises depositing the tantalum nitride on the substrate using a CVD process.

8. The method of claim 6, further comprising:
   applying a heat treatment to the metal layer.

9. The method of claim 8, wherein the heat treatment is applied to the metal layer at least once before doping with fluorine and after doping with fluorine.

10. A method, comprising:
    forming a metal layer having a first work function;
    adjusting the first work function in a selected portion of the metal layer by doping the selected portion with carbon (C), such that the selected portion of the metal layer has a second work function greater than the first work function.

11. The method of claim 10, wherein the first work function ranges from between about 3.7 to 4.5 eV and wherein the second work function ranges from between about 4.7 to 5.3 eV.

12. The method of claim 10, wherein the first work function ranges from between about 4.3 to 4.5 eV and wherein the second work function ranges from between about 4.7 to 5.0 eV.

13. The method of claim 10, wherein the metal layer comprises at least one of ruthenium (Ru), zirconium (Zr), niobium (Nb) and tantalum (Ta).

14. The method of claim 10, further comprising:
applying a heat treatment to the metal layer at least once before doping with carbon or after doping with carbon.

15. A method, comprising:
forming an NMOS active region and a PMOS active region in a substrate;
forming a gate insulating layer on the substrate covering the NMOS active region and the PMOS active region;
forming a metal layer having a first work function on the gate insulating layer;
adjusting the first work function in a selected portion of the metal layer by doping the selected portion with either fluorine to decrease the first work function or carbon to increase the first work function, such that the selected portion has a second work function different from the first work function.

16. The method of claim 15, wherein the first work function is PMOS-compatible and the selected portion is doped with fluorine to make the second work function NMOS-compatible.

17. The method of claim 16, wherein the metal layer comprises at least one of nickel (Ni), ruthenium oxide (RuO), molybdenum nitride (MoN), molybdenum silicide (MoSi$_2$), tantalum silicide (TaSi$_2$), and tantalum nitride (TaN).

18. The method of claim 15, wherein the first work function is NMOS-compatible and the selected portion is doped with carbon to the make the second work function PMOS-compatible.

19. The method of claim 18, wherein the metal layer comprises at least one of ruthenium (Ru), zirconium (Zr), niobium (Nb) and tantalum (Ta).

20. The method of claim 15, further comprising:
forming a buffer layer on the metal layer.

21. The method of claim 20, wherein the buffer layer comprises at least one of poly-silicon and silicon dioxide (SiO$_2$).

22. The method of claim 15, wherein adjusting the work function in the selected portion further comprises:
forming a mask pattern on a portion of the metal layer other than the selected portion; and
ion implanting either fluorine atoms or carbon atoms in the selected portion.

23. The method of claim 22, further comprising:
forming an additional conductive layer on the metal layer.

24. The method of claim 23, wherein the additional conductive layer comprises at least one of poly-silicon, a refractory metal, and a refractory metal silicide.

25. The method of claim 23, further comprising:
forming a PMOS metal gate structure on the PMOS active region and a NMOS metal gate structure on the NMOS active region by selectively patterning the gate insulating layer, the metal layer including the selected portion, and the additional conductive layer.

26. The method of claim 25, wherein the PMOS metal gate structure and NMOS metal gate structure comprise sidewalls, and wherein the method further comprises:
forming respective source and drain regions in the NMOS and PMOS active regions in relation to the PMOS and NMOS metal gate structures using the respective sidewalls as an implant mask.

27. A method, comprising:
forming an NMOS active region and a PMOS active region in a substrate;
forming a gate insulating layer on the substrate covering the NMOS active region and the PMOS active region;
forming a metal layer having a mid-bandgap work function on the gate insulating layer;
adjusting the work function in a first selected portion of the metal layer formed on the NMOS active region by doping the first selected portion with fluorine, such that the first selected portion has a NMOS-compatible work function; and,
adjusting the work function in a second selected portion of the metal layer formed on the PMOS active region by doping the second selected portion with carbon, such that the second selected portion has a PMOS-compatible work function.

28. The method of claim 27, wherein the metal layer comprises at least one of tungsten nitride (WN) and titanium nitride (TiN).

29. The method of claim 27, further comprising:
forming a buffer layer on the metal layer.

30. The method of claim 29, wherein the buffer layer comprises at least one of poly-silicon and silicon dioxide (SiO$_2$).

31. The method of claim 27, wherein adjusting the work function in the first selected portion of the metal layer further comprises:
forming a first mask pattern on the second selected portion of the metal layer and ion implanting fluorine atoms in the first selected portion of the metal layer.

32. The method of claim 31, wherein adjusting the work function in the second selected portion of the metal layer further comprises:
forming a second mask pattern on the first selected portion of the metal layer and ion implanting carbon atoms in the second selected portion of the metal layer.

33. The method of claim 27, further comprising:
forming an additional conductive layer on the metal layer.

34. The method of claim 33, wherein the additional conductive layer comprises at least one of poly-silicon, a refractory metal, and a refractory metal silicide.

35. The method of claim 33, further comprising:
forming a PMOS metal gate structure on the PMOS active region and a NMOS metal gate structure on the NMOS active region by selectively patterning the gate insulating layer, the metal layer including the first and second selected portions of the metal layer, and the additional conductive layer;
wherein the NMOS metal gate structure is formed in part from the first selected portion of the metal layer and the PMOS metal gate structure is formed in part from the second portion of the metal layer other than the selected portion of the metal layer.

36. The method of claim 35, wherein the PMOS metal gate structure and NMOS metal gate structure comprise sidewalls, and wherein the method further comprises:
forming respective source and drain regions in the NMOS and PMOS active regions in relation to the PMOS and NMOS metal gate structures using the respective sidewalls as an implant mask.

37. A method of forming a semiconductor device having a NMOS metal gate structure and a PMOS metal gate structure, the method comprising:

forming a single metal layer having an initial work function on a gate insulating layer;

adjusting the work function for a selected portion of the metal layer by doping either a first selected portion with fluorine to decrease the initial work function, or a second selected portion with carbon to increase the initial work function;

wherein either the PMOS metal gate structure is formed from a first metal gate electrode formed from the second selected portion of the metal layer, or the NMOS metal gate structure is formed from a second metal gate electrode formed from the second selected portion of the metal layer.

38. A method of defining a dual work functions in respective portions of a metal layer, comprising:

selecting a metal type, a formation process adapted to the metal type, and related process conditions to form the metal layer having an initial work function;

selectively doping a first portion of the metal layer with carbon to increase the initial work function, and selectively doping a second portion of the metal layer with fluorine to decrease the initial work function.

39. The method of claim 38, wherein the formation process comprises a Physical Vapor Deposition (PVD) process, a Chemical Vapor Deposition (CVD) process, or an Atomic Layer Deposition (ALD) process.

40. The method of claim 39, wherein one of the related process conditions comprises application of a heat treatment.

* * * * *